United States Patent [19]

Himoto et al.

[11] Patent Number: 5,214,276
[45] Date of Patent: May 25, 1993

[54] SEMICONDUCTOR STRUCTURE FOR PHOTODETECTOR

[75] Inventors: Takeshi Himoto; Ichiro Tonai, both of Osaka, Japan

[73] Assignee: Sumitomo Electric Indsutries, Ltd., Osaka, Japan

[21] Appl. No.: 787,954

[22] Filed: Nov. 5, 1991

[30] Foreign Application Priority Data

Nov. 13, 1990 [JP] Japan ................................. 2-308094

[51] Int. Cl.$^5$ ............................................. H01J 40/14
[52] U.S. Cl. ................... 250/214.1; 257/431
[58] Field of Search ................. 250/211 J, 211 R; 357/30 L, 30 R; 372/99

[56] References Cited

U.S. PATENT DOCUMENTS

| | | | |
|---|---|---|---|
| 3,579,130 | 5/1971 | Smiley | 372/99 |
| 3,969,751 | 7/1976 | Drukaroff et al. | 357/30 L |
| 4,727,407 | 2/1988 | Nobue et al. | 357/30 L |
| 4,916,305 | 4/1990 | Antell | 250/211 J |

FOREIGN PATENT DOCUMENTS 63-227056 9/1988 Japan .

Primary Examiner—David C. Nelms
Attorney, Agent, or Firm—Cushman, Darby & Cushman

[57] ABSTRACT

A photodiode comprises e.g. an n-type semiconductor layer, a p-type semiconductor region selectively formed in a central part from a surface of the n-type semiconductor layer, a dish-like shaped pn-junction therebetween, an annular electrode formed on the p-type region, an electrode formed on the other side of the n-type semiconductor layer, and a dielectric layer deposited on the n-type semiconductor layer for preventing light from attaining to the semiconductor layer by reflecting a dielectric multilayer consisting of two different media having effective thicknesses equal to one fourth of the wavelength of the light.

8 Claims, 6 Drawing Sheets

SEMICONDUCTOR STRUCTURE FOR PHOTODETECTOR

FIELD OF THE INVENTION

This invention relates to an improvement for raising the response speed of a photodetector.

BACKGROUND OF THE INVENTION

A photodiode has a pn-junction. The pn-junction is reversely biased in operation of the photodiode. Although various types of photodiodes have been fabricated, a typical photodiode has a bottom electrode deposited on a bottom surface of a substrate and a ring electrode deposited on a light-receiving region of the reverse side of the substrate. External light enters the light-receiving region and arrives at the pn-junction. The light excites plenty of pairs of electron and hole at the pn-junction. Since the pn-junction is reversely biased, electrons are attracted to the n-type region and holes are attracted to the p-type region. Thus, electric current flows in proportion to the intensity of the incident light.

FIG. 7 and FIG. 8 show a structure of a conventional PIN type photodiode having an InGaAs light-receiving layer. In the photodiode, an undoped InP buffer layer (2a), an undoped InGaAs light receiving layer (2b) and an undoped InP window layer (2c) have been epitaxially grown on an n+-InP substrate (1) in succession. A p-type region (3) has been selectively formed in a central part of the diode by implanting p-type dopant ions or diffusing p-type dopant atoms on the undoped InP window layer. An annular p-side electrode (5) has been formed on the periphery of the p-type region (3).

The central part of the p-type region (3) enclosed by the annular p-side electrode (5) is a light receiving region. The peripheral part of the undoped InP window layer (2c) out of the annular p-side electrode (5) is coated with a protective film (8).

An n-side electrode (7) has been formed on the bottom side of the n+-InP substrate (1). The pn-junction between the p-type region (3) and the undoped InGaAs light receiving layer (2b) is reversely biased by applying voltage between the p-side electrode (5) and the n-side electrode (7). Here, the reverse bias means that the n-side electrode (7) is connected to a positive electrode and the p-side electrode (5) is connected to a negative electrode of a DC current power source. Most of the voltage of the power source is applied to the pn-junction. A strong electric field is established at the pn-junction.

External light passes through an antireflection film (4) enclosed by the p-side electrode (5) and attains to the pn-junction in the undoped InGaAs light receiving layer (2b). Each photon of the light excites a pair of electron and hole. The electric field existing at the pn-junction pushes the electrons toward the n-side electrode (7), and the holes toward the p-side electrode (5). An electric current is induced by the flow of the electrons and holes. This current is often called a photocurrent.

Prior art has a drawback of which man is not still aware perhaps. In a conventional photodiode, external light also enters the peripheral part outside of the annular p-side electrode (5), because the protective film (8) is transparent to light. This peripheral part is now called a light non-receiving region or in brief, a non-receiving region, because it is undesirable that external light enters this region. Since the non-receiving region is only covered with a protective film (8) which is transparent to light, external light can pass through the protective film.

The light which has entered the peripheral, non-receiving region, also excites pairs of electron and hole. But there is no electric field at the non-receiving region, because the non-receiving region contains no pn-junction. The electrons and holes are not carried by an electric field. Thus, people may think that the electrons and holes would soon vanish by recombination without any bad effects. But this is wrong. The lifetime of the excited electrons and holes if pretty long. As the excited electrons and holes are not carried by an electric field, they are accumulated there. The carrier concentration becomes locally higher. Thus, the electrons and holes diffuse along with the gradient of the carrier (electrons and holes) concentration. Some of the diffused carriers attain to the pn-junction. Such electrons and holes also contribute to the photocurrent.

However, the movement by the diffusion is very slow, because of the low gradient of carrier concentration. Thus, it takes long time from the reception of light to the generation of the additional photocurrent. Such a slow drift of the carriers borne in the non-receiving region blunts the response of the photodiode. As shown in FIG. 6, the photocurrent of the photodiode is accompanied by a dull tail which is induced by the diffusion of carriers. In FIG. 6, the abscissa denotes the time in nanosecond (ns). The ordinate denotes the response of photocurrent of the photodiode.

The quick, forward, strong photocurrent is brought about by the light entering the central light receiving region enclosed by the annular p-side electrode (5). The dull, backward, weak tail of photocurrent is induced by the light entering the peripheral non-receiving region. The undesirable light delays the response of the photodiode.

In the case of the photodiode used for optical communication, the light emitted out of an optical fiber is converged by a lens system to a central receiving region of the photodiode. However, owing to the disorder of optical system, e.g. an axial misarrangement of lenses or optical fibers, part of the light emitted from the optical fiber sometimes deviates from the normal receiving region. The partial light enters the non-receiving region and generates extra pairs of electron and hole. The electrons and holes borne in the non-receiving region delays the response of the photodiode by adding the tail induced by the diffused carriers thereto.

Especially in the case of a photodiode for high speed response, the area of the light receiving region is usually very narrow in order to reduce the capacitance of the pn-junction. Thus, bigger proportion of the light enters the non-receiving region. The proportion of diffusion current in the photocurrent increases. The increment of the diffusion current deteriorates the response performance of the photodiode. These are problems of the photodiode mounted on a receiving side of an optical communication system. There are another problems also for a monitor photodiode mounted on a sending side. The photodiode of a sending side is sometimes installed to regulate the output power of a laser diode. The monitor photodiode detects the intensity of the light emitted from the rear end of the laser diode. The output of the monitor photodiode is compared with a standard value. Then, the driving current sent to the laser is reduced or increased to the direction of reducing the difference between the output and the standard value. By the negative feed-back, the intensity of the light emitted from the laser diode is stabilized to a definite value. In this case, if light from the laser diode enters also the non-receiving region, the partial light will induce an additional current owing to the diffusion of the carriers. The additional current delays the response of the monitor photodiode. The delay of the response retards the negative feed-back controlling. Thus, the output power of the laser diode will fluctuate to some extent.

The purpose of this invention is to provide a photodetector excelling in the response performance.

Another purpose of this invention is to provide a photodetector whose response includes no tail induced by the diffusion current.

SUMMARY OF THE INVENTION

This invention proposes a photodetector having the non-receiving region which is covered with dielectric layers for preventing external light from entering the non-receiving region. The dielectric layers reflect or absorb the light. Thus, external light cannot attain to semiconductor layer of the non-receiving region. Since no external light enters the non-receiving region, no pair of electron and hole is created in the region. No drift current flows to the pn-junction. The tail of response current of the photodiode vanishes.

This invention makes use of either reflective dielectric layers or absorptive dielectric layers. In the case of reflection, a dielectric multilayer mirror is preferable, because it can reflect nearly all of the incident light. In the case of absorption, a dielectric layer having high absorption for light should be used in order to attenuate the light in the layer.

With reference to FIG. 1 and FIG. 2, the structure of the photodetector of this invention will be explained. This is an example having an n-type semiconductor substrate. Of course, the substrate can be replaced by a p-type substrate. In the case, all the layers should be replaced by the layers of the reverse conduction type.

In the figures, an undoped semiconductor layer as a light receiving layer (2) is deposited on an n-type substrate (1). The light receiving layer (2) may be constituted by a plurality of layers. Selective doping of p-type dopant atoms by ion implantation or diffusion forms a p-type region (3) (doubly hatched) at the center of the light receiving layer (2). This is a light receiving region. In the light receiving layer (2), the lower part and upper, peripheral part hatched singly are n-type semiconductor. The central, upper part hatched doubly is p-type semiconductor. Between them, a pn-junction with a dish-like cross section is formed. An n-side electrode (7) is formed on the rear surface of the n-type substrate (1). An annular p-side electrode (5) is formed on the periphery of the p-type region (3). An antireflection film (4) is deposited on the region enclosed by the annular p-side electrode (5). A protective film (8) is deposited on the light receiving layer (2) outside of the annular p-side electrode (5). The structures mentioned so far are all the same as the prior art. Besides these layers, a dielectric layer (6) is deposited on the protective film (8) for reflecting or absorbing nearly all the light entering thereto. Since the dielectric layer (6) reflects or absorbs almost all light, no light attains to the light receiving layer (2).

The function of the photodetector of this invention is explained. The part of the light receiving layer (2) except the central receiving-region enclosed by the annular electrode is covered with a multilayer comprising the dielectric layer (6) and the protective film (8). Even if part of external light deviates from the annular electrode (5), it will be intercepted by the multilayer comprising the dielectric layer (6) and the protective film (8). Since no external light reaches the semiconductor below the protective film (8), no pair of electron and hole is excited and no diffusion current flows in the non-receiving region of the semiconductor layer (2). Accordingly, parasitic, delayed signal will not occur. The response signal of the photodetector is accompanied by no tail. The response performance of the photodetector is improved to a great extent.

DETAILED DESCRIPTION OF THE EMBODIMENTS

Figure 1:
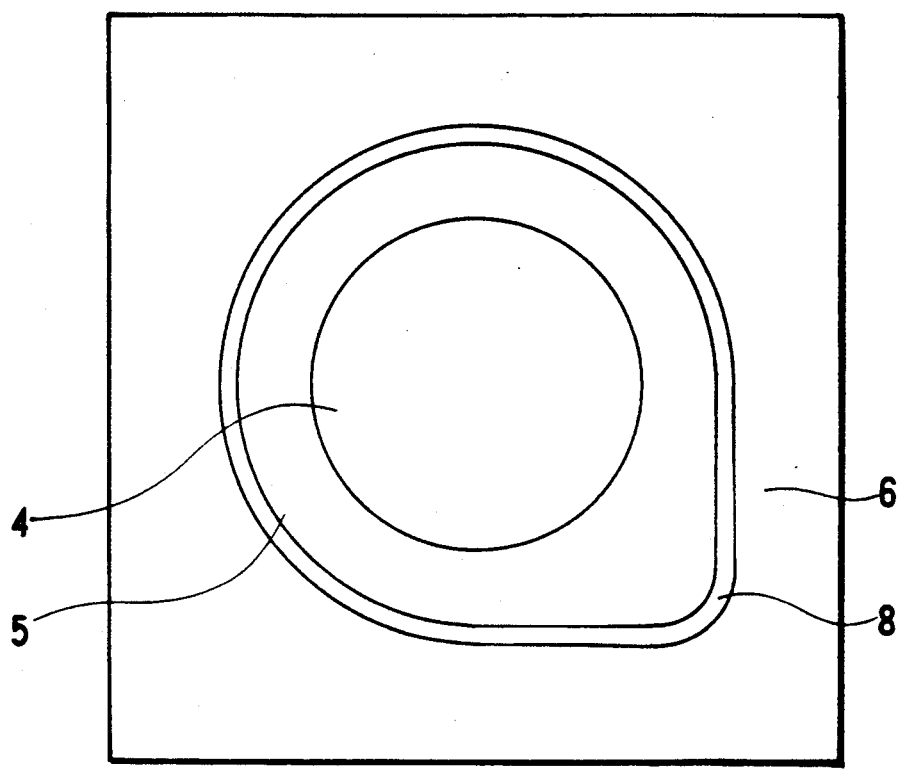
FIG. 1 is a plan view of a photodetector of this invention.
Figure 2:
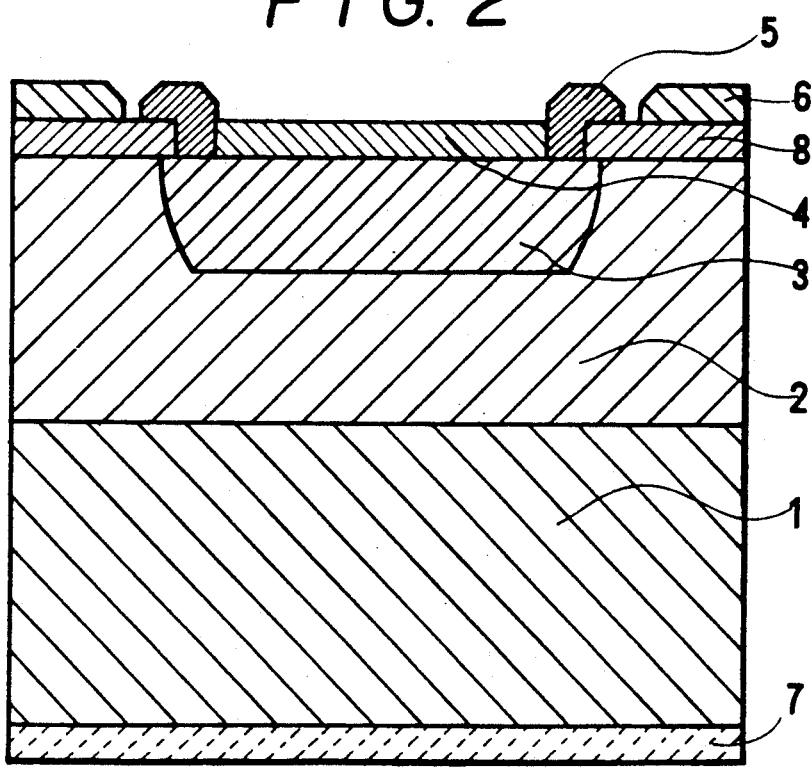
FIG. 2 is a sectional view of the same photodetector shown in FIG. 1.
Figure 3:
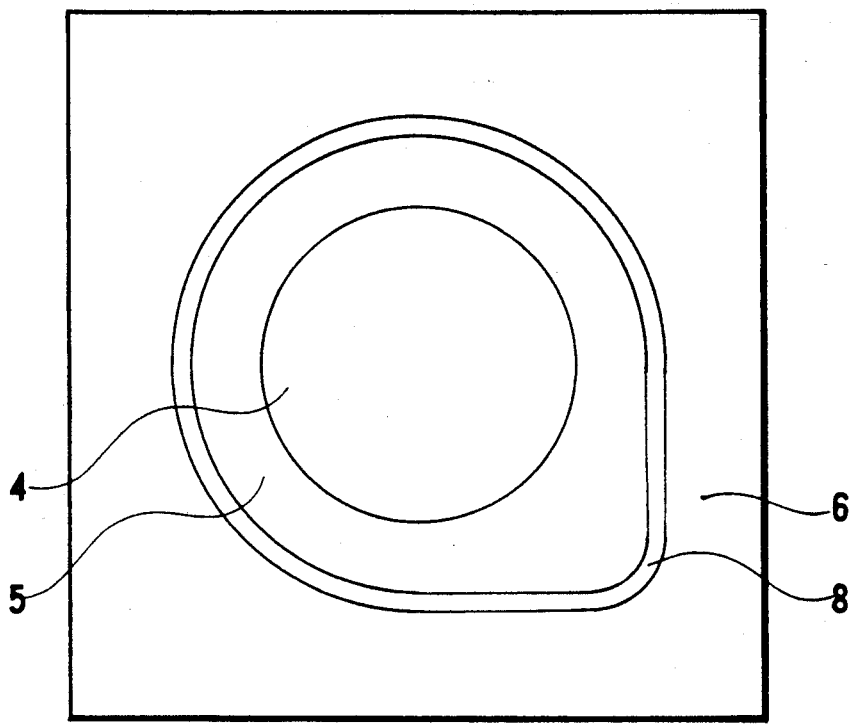
FIG. 3 is a plan view of a photodetector of an embodiment of this invention.
Figure 4:
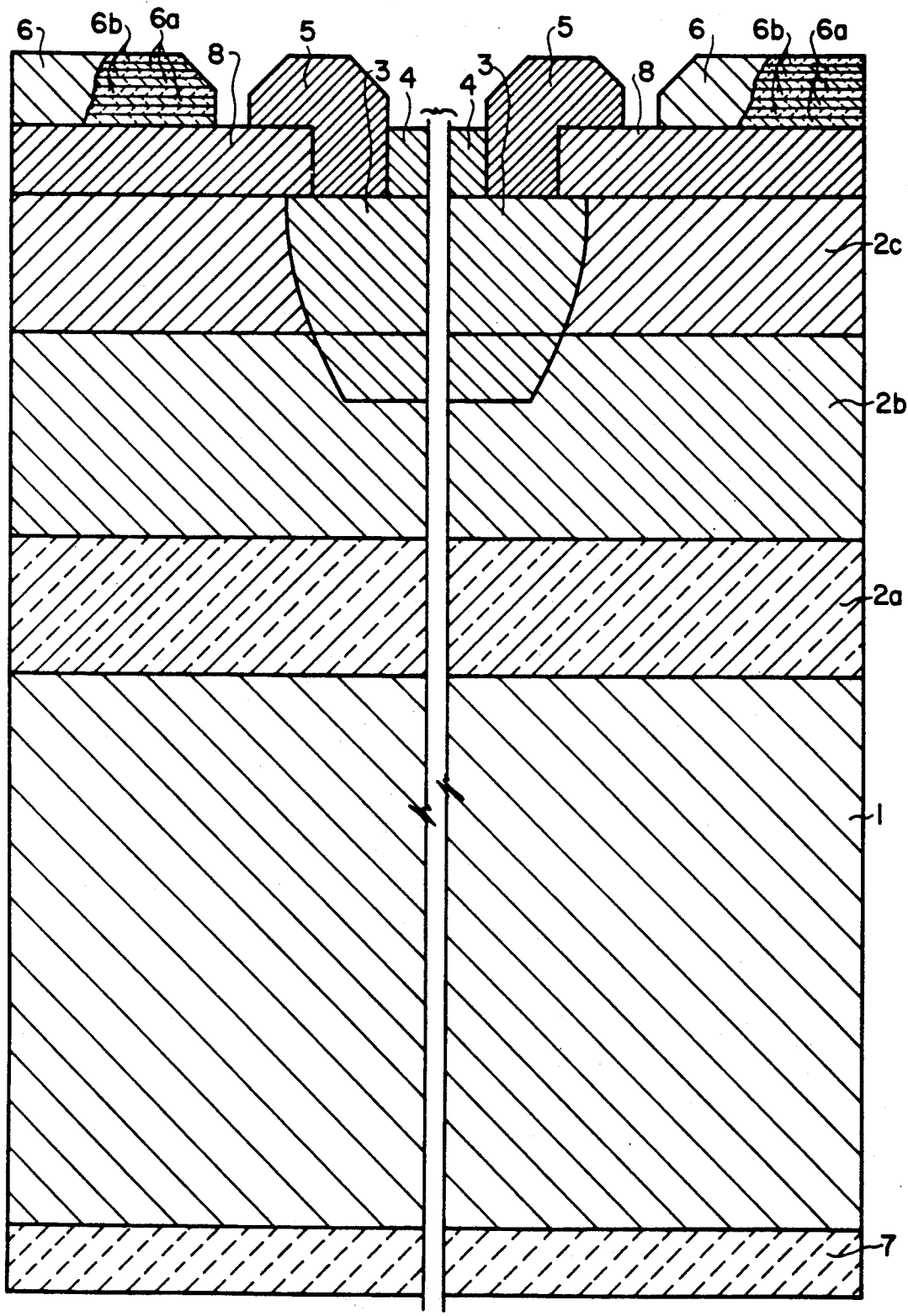
FIG. 4 is a sectional view of the same photodetector shown in FIG. 3.

An embodiment of this invention will be explained with reference to FIG. 3 and FIG. 4. This is an example employing an n+-type substrate. On the n+-type substrate, the following semiconductor layers (2a) to (2c) were grown in turns. The compound, carrier concentration and thickness of each layer are as follows:

| (1) n+-type InP substrate | $n = 2 \times 10^{18}$ cm$^{-3}$ |
|---|---|
| (2a) undoped InP buffer layer | $n = 2 \times 10^{15}$ cm$^{-3}$ thickness 2 μm |
| (2b) undoped InGaAs receiving layer | $n = 2 \times 10^{15}$ cm$^{-3}$ thickness 3.5 μm |
| (2c) undoped InP window layer | $n = 2 \times 10^{15}$ cm$^{-3}$ thickness 2 μm |

A p-type region (3) was selectively formed at a central part of each device by diffusing zinc (Zn) to the masked InP wafer by the closed tube method. The p-type region (3) became a light receiving region. The Zn doping provided the device with a PIN (p-type, intrinsic and n-type semiconductors) structure. The diameter of the p-type region (3) was 100 μm. An annular p-side electrode (5) was formed on the periphery of the p-type region (3). An n-side electrode (7) was formed on the bottom surface of the n+-type substrate.

The surface of the light receiving region enclosed by the p-side electrode (5) was coated with an antireflection film (4), e.g. a silicon nitride (SiN) film with refractive index of 1.8 with a thickness of 200 nm.

The surface of the non-receiving region outside of the annular electrode (5) was coated with a protective film (8), e.g. a SIN or SiON film grown by the plasma CVD (Chemical Vapor Deposition) method. For instance, a SiN layer with refractive index of 1.8 was grown to 215 nm in thickness.

Furthermore, a dielectric layer (6) is deposited on the protective film (8) in the non-receiving region in order to forbid external light from entering the semiconductor by absorbing or reflecting almost all the incident light. The protective film (8) can be conveniently constituted by a multilayer including a plurality of dielectric films with pertinent refractive index and pertinent thickness in order to reflect almost all lights. FIG. 4 shows a multilayer fabricated by depositing repeatedly individual dielectric sublayers (6a) and (6b) by turns.

In the case of the photodiode for detecting the light with a wavelength of 1.55 μm emitted from a laser diode, a dielectric multilayer was fabricated by the processes shown in FIG. 5. Although FIG. 5s show a single unit of photodiode, it is a part of a wafer on fabrication on which many units of photodiodes will be made. After the wafer process, it will be sliced into plenty of units of photodiodes. FIG. 5 starts from the units on a wafer in which main parts of photodiodes have been fabricated. The structure of the photodiode and the method for producing it are known well.

Figure 5A:
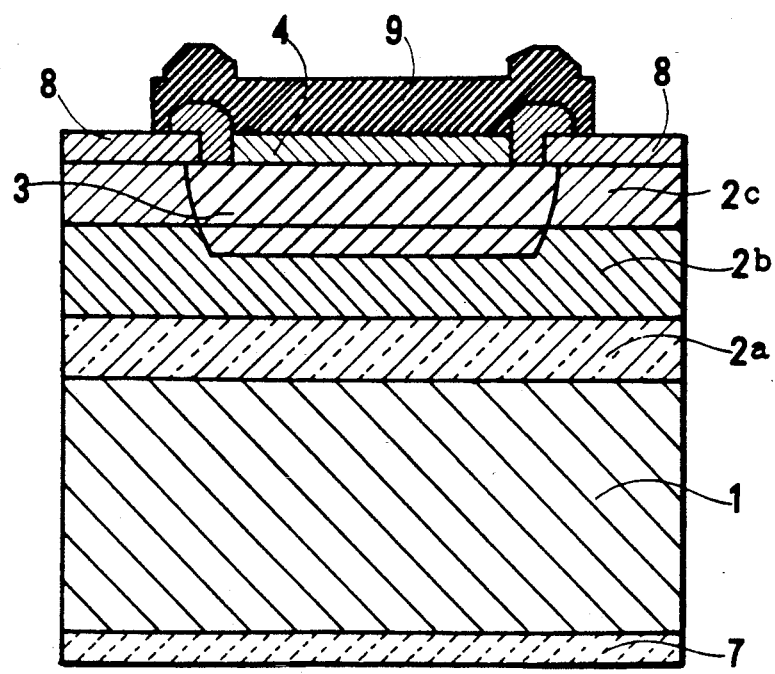
FIG. 5(a) is a sectional view of a photodiode on fabrication process in which the antireflection film (4) and the annular electrode (5) is covered with a photoresist layer (9).

A photoresist layer (9) was selectively deposited to a thickness of about 2 μm by the usual photolithography method on the antireflection film (4), the annular electrode (5) and part of the protective film (8) which should not be covered with the dielectric layer (6). This was done by the steps of painting photoresist on the whole of the semiconductor wafer, exposing the wafer through a mask and developing the photoresist. FIG. 5(a) shows the device having the selectively deposited photoresist layer (9). In this case, the part of the protective film (8) which is not covered with the photoresist layer (9) is exposed outwardly.

Figure 5B:
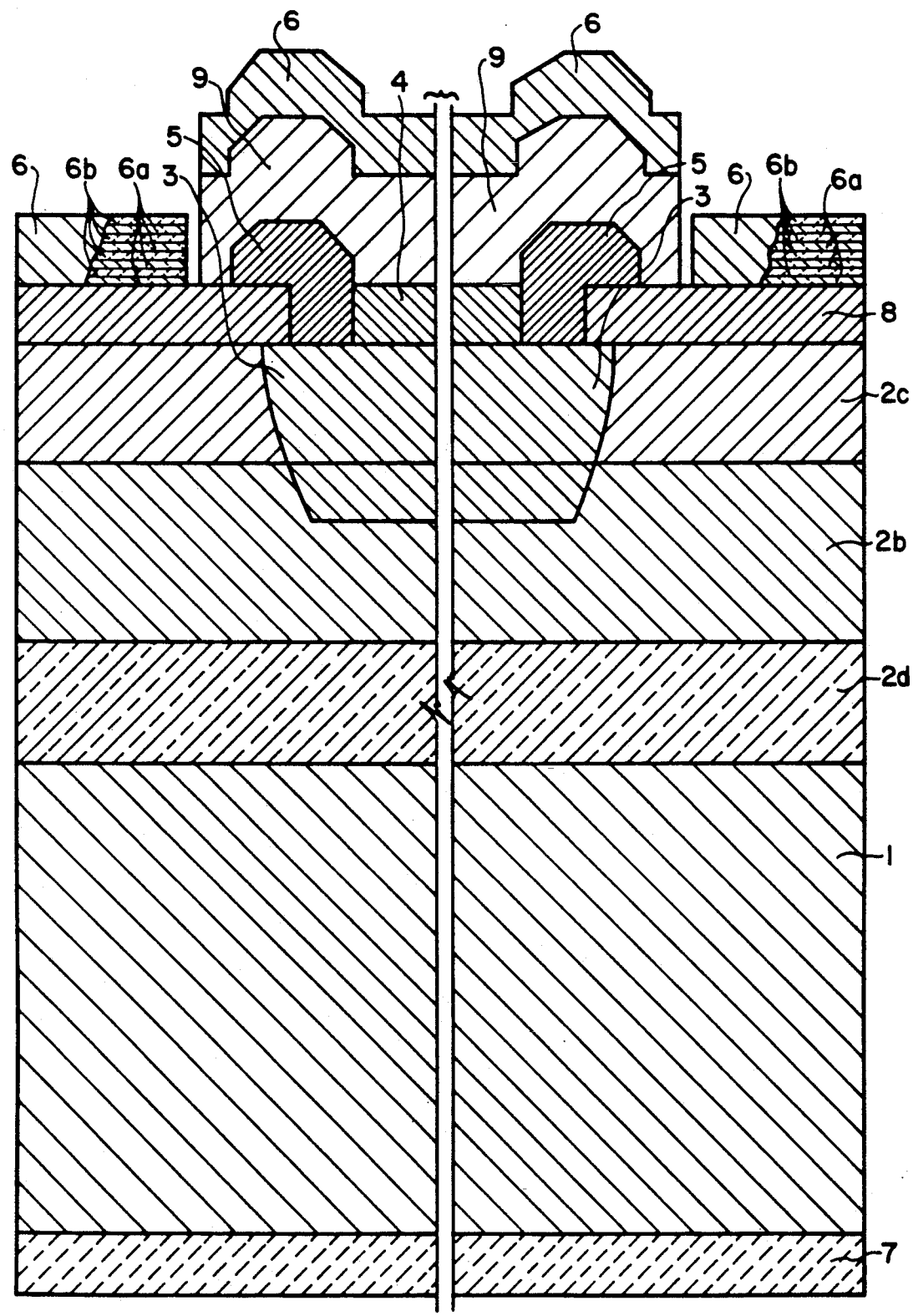
FIG. 5(b) is a sectional view of a photodiode on fabrication process in which a dielectric layer is deposited on the photoresist layer and the protective layer.

Then amorphous silicon films (a-Si) (6a) with a thickness of 120 nm with a refractive index of 3.2 and silicon nitride (SiN) films (6b) with a thickness of 215 nm with a refractive index of 1.8 were by turns deposited four times as a dielectric multilayer. Thus, the dielectric multilayer consists of eight films of a-Si and SiN. The total thickness is 1340 nm. This state is shown by FIG. 5(b). There is a dielectric layer (6) constituted by plural a-Si films (6a) and plural SiN films (6b) on the photoresist layer (9) and the protective film (8). The enlarged sectional view of the dielectric layer (6) is shown on the upper, right side of FIG. 5(b). Here, (6a) denotes the amorphous silicon film (a-Si) and (6b) denotes the SiN (silicon nitride) film.

Figure 5C:
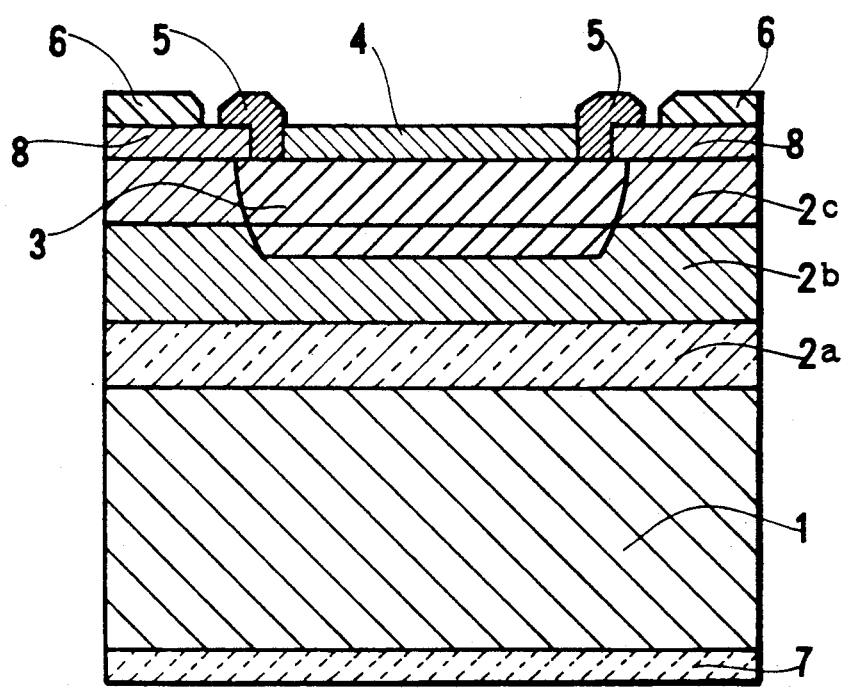
FIG. 5(c) is a sectional view of a photodiode on fabrication process in which the photoresist layer is eliminated by an organic solvent.
Figure 6:
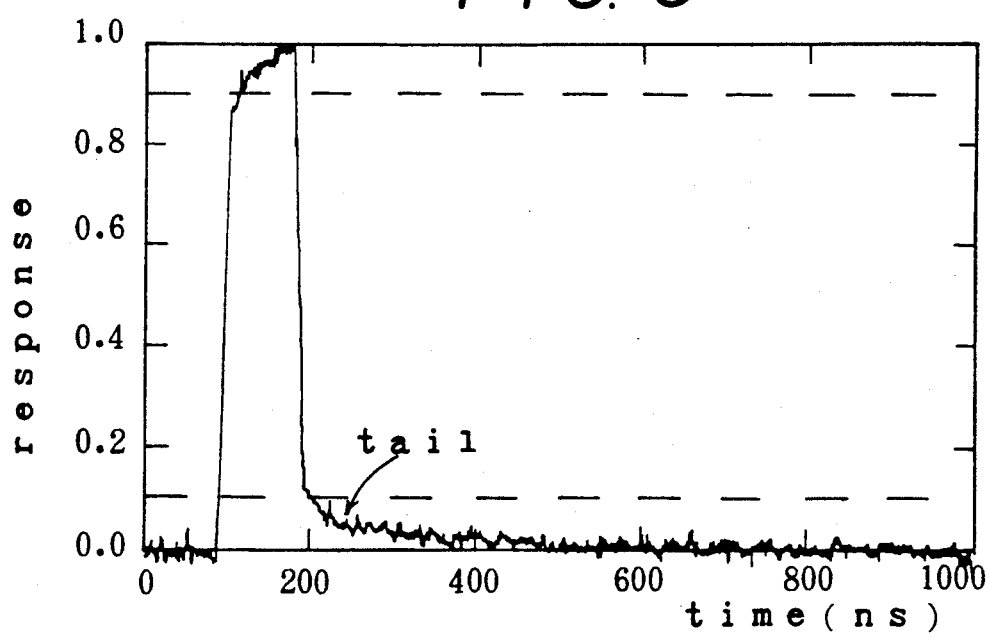
FIG. 6 is a graph showing the pulse response performance of a conventional photodiode.
Figure 7:
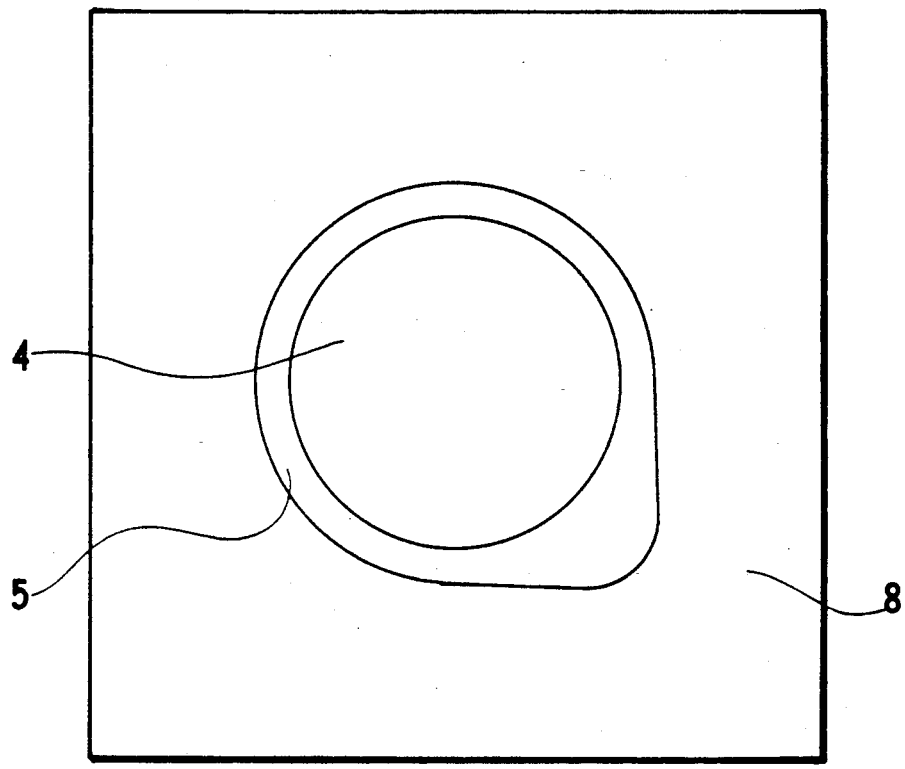
FIG. 7 is a plan view of a conventional photodiode.
Figure 8:
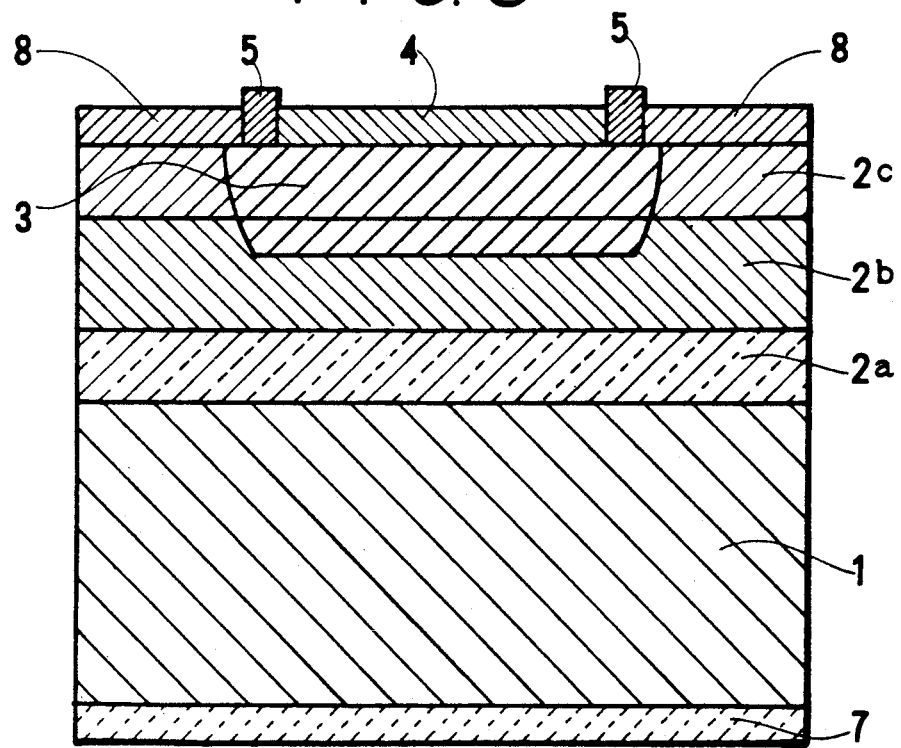
FIG. 8 is a sectional view of the same photodiode shown in FIG. 7.

Then the photoresist layer (9) was eliminated by an organic solvent. The dielectric layer (6) on the photoresist layer (9) was also eliminated together with the photoresist layer (6). Only the dielectric layer (6) on the protective film (8) was left as it was. FIG. 5(c) shows the state after this process.

The multilayer including the dielectric layer (6) and the protective film (8) exhibited almost 100% of reflection rate for the light with a wavelength of 1.55μ m by the action of the multireflection. Therefore, the light entering the non-receiving region cannot attain to the semiconductor layers, because it is reflected almost by 100% by the dielectric layer (6) and the protective film (8). Accordingly no pair of electron and hole is excited in the semiconductor under the dielectric layer (6). No carriers drift by the diffusion to the pn-junction in the same semiconductor region. Because of nor drift carriers, no tail appears after the main pulse signal of the photodiode for a pulse of incident light. Thus, the response performance of the photodiode is improved.

The reflection by the dielectric multilayer is now explained. Although is has been known well as a dielectric multilayer mirror, e.g. the mirrors used for gas lasers.

When light goes from a medium of lower refractive index to another medium of higher refractive index, part of light is reflected with a phase change of $\pi$ (180 degrees). When light goes from a medium of higher refractive index to another medium of lower refractive index, part of light is reflected without phase change to the contrary. Dielectric multilayer is fabricated by making use of such a simple optical rule. A two-layer device consisting of two different media (first and second) with effective thickness of one fourth of the wavelength of the incident light, i.e. $n_1 d_1 = n_2 d_2 = \lambda/4$, is assumed, where $n_1$ and $n_2$ are refractive indices of the first medium and the second one, $d_1$ and $d_2$ are thicknesses of the first and the second, and $\lambda$ is a wavelength of the incident light in vacuum. When light goes and returns in one of the layer, the phase of the light delays by $\pi$ (180 degrees), since the light propagates by half of a wavelength. Thus, if $n_1 > n_2$, first light which is reflected on the surface of the first layer ($n_1$) changes the phase by $\pi$ (180 degrees) because the first layer has a higher refractive index than air ($n_0 = 1$). Second light which passes the first layer ($n_1$) and is reflected at the interface between the first layer ($n_1$) and the second layer ($n_2$) without phase change, because $n_1 > n_2$. Although the optical paths are different for the first and second light by $\pi$, total phase difference between the two is 0 or $2\pi$ because of a phase change of $\pi$ at the surface. Thus, the first and the second light intensify together, because they have the same phase.

In general, a multilayer having the repetition of the two-layer devices $n_1, n_2, n_1, n_2 \ldots$ is assumed. Third light which passes the first layer ($n_1$) and the second layer ($n_2$), and is reflected at the second interface between the second layer ($n_2$) and the third layer ($n_1$) with a phase change of $\pi$, because $n_1 > n_2$. The total phase difference between the third light and the second light is 0 or $2\pi$. Thus, the third light and the second light intensify together. By the induction method, all partial lights which are reflected at interfaces between the first medium ($n_1$) and the second medium ($n_2$) and between the second medium ($n_2$) and the first medium ($n_1$) are proved to have the same phase and intensify together.

Thus, a multilayer having nearly 100% of reflection rate can be obtained by depositing by turns two different media having an effective thickness equal to one fourth of the wavelength.

It is always true that all partial lights reflected at interfaces have the same phase is such a multilayer having many sublayers made from two different media deposited by turns under the restrictions:

$$n_1 d_1 = \pi/4 \qquad (1)$$

$$n_2 d_2 = \pi/4 \quad (2)$$

where $n_1$ and $n_2$ are the refractive indices of one medium and the other medium, $d_1$ and $d_2$ are the thicknesses of one and the other and $\lambda$ is the wavelength of the light in vacuum. However, the first partial light which is reflected at the surface of the multilayer does not have necessarily the same phase as all other partial lights which are reflected at the interfaces of the media. In brief, the first partial light reflected at the surface, i.e. interface between air ($n_0 = 1$) and the first medium ($n_1$) is called now surface reflection light. All the partial light reflected at the interfaces are called now interface reflection lights.

Under these definitions, all interface reflection lights have the same phase. They always intensify together. But the phase difference between the surface reflection light and the interface reflection lights depends on the inequality between $n_1$ and $n_2$.

If $n_1 > n_2$, the phase of the surface reflection light coincides with that of all the interface reflection lights. The interface reflection lights are intensified by the surface reflection light.

If $n_1 < n_2$, the phase of the surface reflection light differs by $\pi$ (180 degrees) from that of all the interface reflection lights. The surfaces reflection light weakens the interface reflection lights in contradiction thereto. However, even in this case, almost all partial lights are reflected if the number of the sublayers is sufficient, because the interface reflection lights are far stronger than the surface reflection light.

The case of $n_1 > n_2$ is more preferable than the case of $n_1 < n_2$ from the consideration of reflection. But the latter case of $n_1 < n_2$ is here employed. In FIG. 4, dielectric layer (6) consists of amorphous silicon (a-Si) sublayers (6a) and silicon nitride sublayers (6b) which are by turns deposited several times. In the example, the a-Si sublayer has a refractive index $n_2$ of 3.2, and a thickness $d_2$ of 120 nm. The product of $d_2 = 120$ nm and $n_2 = 3.2$ is 384 nm. This is just one fourth of the wavelength $\lambda = 1550$ nm of the incident light. Similarly, the silicon nitride (SiN) sublayer has a refractive index $n_1$ of 1.8, and a thickness $d_1$ of 215 nm. The product of $n_1 = 1.8$ and $d_1 = 215$ nm is 387 nm, which is also one fourth of the wavelength of the light. In this case, since the refractive index $n_2$ of a-Si is higher than $n_1$ of SiN, it is desirable to position an a-Si sublayer on the top of the dielectric layer (6) from the standpoint of optics. However, a-Si is inferior to SiN in chemical resistance. Thus, SiN was allocated to the top sublayer. In the example, the sublayers were deposited by turns five times. Thus, the total thickness was 1675 nm.

Such a multilayer mirror is well known. Other material can freely be chosen as media of the dielectric multilayer. The dielectric multilayer can reflect almost by 100% the light having a definite wavelength. Other lights with a different wavelength are not reflected so perfectly. However, an optical communication system uses a monochromatic light with a definite wavelength. No other light with a different wavelength can enter there. Thus, other light has less importance on the photodetector.

The antireflection film (4) constituted by silicon nitride (SiN) makes use of the reverse asymmetry of the refractive indices. Since the refractive index $n_1$ of SiN is lower than the refractive index $n_3$ of indium phosphide (InP), namely, $n_1 < n_3$, the reflection is alleviated, because the light reflected on the surface of the SiN antireflection film (4) is partially cancelled by the light reflected on the interface between the SiN film (4) and the InP layer (2c).

Furthermore, if the antireflection film (4) has the effective thickness of one fourth of the light, i.e. $d_1 n_1 = 80/4$ and if $$n_3^{\frac{1}{2}} = n_1 \quad (3)$$

the light reflected on the film (4) is totally cancelled by all the partial lights which are emitted from the antireflection film (4) after multireflection between the surface and the interface. The dielectric constant of InP at high frequency is nearly 9.61. Thus, the refractive index $n_3$ of InP is nearly 3.1. If the film (4) is made from silicon nitride SiN, Eq.(3) holds, because $n_3 = 3.1$ and $n_1 = 1.8$. Therefore, the SiN film having a thickness of $\lambda/4n_1$ acts as nearly a perfect antireflection film. Thus, the medium and the thickness of the antireflection film (4) is determined by the semiconductor of the photodetector.

What characterizes the present invention is the dielectric layer (6). In the embodiment, a dielectric multilayer mirror having high reflection rate was used. Alternatively, an opaque dielectric layer with high absorption to the light can be used for the dielectric layer (6) for preventing the light from attaining to the semiconductor layer by absorbing it.

In the embodiment, the active semiconductor of the photodetector was InGaAs grown on an $n^+$-InP substrate. The present invention is applicable to any semiconductor photodetectors, e.g. GaAs, AlGaAs, InGaAsP, Ge, or Si photodetectors. When the active layer is three or four component mixed crystal, it should be grown on a two component mixed crystal, e.g. AlGaAs/GaAs, InGaAsP/InP. This invention is also applicable to such a device having an active semiconductor being grown on a $p^+$-type substrate.

Although the present invention has been explained along with an embodiment of a PIN photodiode, it can be also applied to another photodetectors, e.g. an avalanche photodiode, having a pn-junction, and an annular electrode for receiving light.

What we claim is:

1. A photodetector comprising:
   a semiconductor layer being one of an n-type and a p-type having two surfaces,
   a semiconductor region being one of a p-type and an n-type, respectively, selectively formed in a central part from one surface of the semiconductor layer,
   a dish-like shaped pn-junction formed between the semiconductor layer and the semiconductor region,
   an annular electrode formed on the semiconductor region,
   a second electrode formed on the other surface of the semiconductor layer, and
   a dielectric layer formed outside of the annular electrode from preventing light from reaching the semiconductor layer by reflecting or absorbing the light.

2. A photodetector comprising:
   an semiconductor substrate being one of an $n+$-type and $p+$-type having, two surfaces,
   an undoped semiconductor layer deposited on one surface of the semiconductor substrate,
   a semiconductor region, being one of a p-type or n-type region respectively, selectively formed in a central part from one surface of the undoped semiconductor layer, a dish-like shaped pn-junction formed between the undoped semiconductor layer and the semiconductor region, an annular electrode formed on the semiconductor region, a second electrode formed on the other surface of the semiconductor substrate, and a dielectric layer formed outside of the annular electrode for preventing light from reaching the semiconductor layer by reflecting or absorbing the light.

3. A photodetector as claimed in claim 1 or 2, wherein the dielectric layer is a dielectric multilayer including alternating deposited first sublayers and second sublayers with different refractive indices having effective thickness equal to one fourth the wavelength of the light.

4. A photodetector as claimed in claim 1 or 2, wherein the dielectric layer is an opaque medium with an absorption factor high enough so that the light cannot reach the semiconductor under dielectric layer.

5. A photodetector as claimed in claim 1 or 2, wherein the dielectric layer is a dielectric multilayer including alternating deposited a-Si sublayers with a refractive index of 3.2 and SiN sublayers with a refractive index of 1.8, with the sublayers having effective thicknesses equal to one fourth of a wavelength of the light.

6. A photodetector as claimed in claim 1 or 2, wherein the light has a wavelength of 1.55 μm and the dielectric layer is a dielectric multilayer including alternating deposited a-Si sublayers with a refractive index of 3.2 having a thickness of 120 nm, and SiN sublayers with a refractive index of 1.8 having a thickness of 215 nm.

7. A photodetector comprising:

an n+-type InP substrate with two surfaces, an undoped InP buffer layer deposited on the n+-type InP substrate, an undoped InGaAs receiving layer deposited on the undoped InP buffer layer, an undoped InP window layer, a p-type region selectively formed in a central part of the undoped InP window layer and upper half of the InGaAs receiving layer by ion-implantation or diffusion of Zn, a dish-like shaped pn-junction formed between the p-type region and the undoped InP window layer and the undoped InGaAs receiving layer, an annular electrode formed on the p-type region, another electrode formed on the other surface of the n+-type InP substrate, an antireflection film deposited on the p-type region (3) enclosed by the annular electrode, a protective film deposited on the undoped InP window layer outside of the annular electrode, and a dielectric layer formed on the protective film for preventing light from reaching the undoped InGaAs receiving layer by reflecting or absorbing the light completely.

8. A photodetector as claimed in claim 7, wherein the dielectric layer is a dielectric multilayer fabricated by depositing by turns a-Si sublayers with a refractive index of 3.2 having a thickness of 120 nm, and SiN sublayers with a refractive index of 1.8 having a thickness of 215 nm.

* * * * *